(12) United States Patent
Fu et al.

(10) Patent No.: US 10,707,598 B2
(45) Date of Patent: Jul. 7, 2020

(54) CONDUCTIVE TERMINAL AND CONNECTOR ASSEMBLY

(71) Applicant: Tyco Electronics (Shanghai) Co. Ltd., Shanghai (CN)

(72) Inventors: Xiaozhi Fu, Shanghai (CN); Ming Shi, Shanghai (CN); Hongtao Jiang, Shanghai (CN); Wei Zhang, Shanghai (CN); Dingbing Fan, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/254,709

(22) Filed: Jan. 23, 2019

(65) Prior Publication Data
US 2019/0229445 A1 Jul. 25, 2019

(30) Foreign Application Priority Data
Jan. 23, 2018 (CN) .................... 2018 2 0113480 U

(51) Int. Cl.
| | |
|---|---|
| H01R 12/51 | (2011.01) |
| H01R 12/58 | (2011.01) |
| H05K 1/18 | (2006.01) |
| H01R 4/48 | (2006.01) |
| H01R 12/57 | (2011.01) |
| H01R 12/53 | (2011.01) |

(52) U.S. Cl.
CPC ......... *H01R 12/515* (2013.01); *H01R 4/4818* (2013.01); *H01R 12/57* (2013.01); *H01R 12/58* (2013.01); *H05K 1/181* (2013.01); *H01R 12/53* (2013.01); *H05K 2201/0949* (2013.01); *H05K 2201/09072* (2013.01); *H05K 2201/09445* (2013.01); *H05K 2201/1031* (2013.01); *H05K 2201/10295* (2013.01)

(58) Field of Classification Search
CPC .... H01R 13/113; H01R 13/112; H01R 4/4818
See application file for complete search history.

(56) References Cited

U.S. PATENT DOCUMENTS

| | | | | |
|---|---|---|---|---|
| 1,622,631 A | * | 3/1927 | Nestock | H01R 4/4809 439/857 |
| 2,122,252 A | * | 6/1938 | Hayes | H01R 4/22 174/87 |
| 3,363,224 A | * | 1/1968 | Gluntz | H01R 13/11 439/852 |

(Continued)

*Primary Examiner* — Ross N Gushi
(74) *Attorney, Agent, or Firm* — Barley Snyder

(57) ABSTRACT

A conductive terminal is adapted to electrically connect a wire to a circuit board. The circuit board has a through hole and solder pads on a surface of the circuit board. The conductive terminal comprises a base, a pair of mounting portions, and a pair of clamping portions. The base has a pair of opposing first edges, a pair of opposing second edges, and an insertion hole aligned with the through hole of the circuit board. The mounting portions include a pair of solder portions extending outwardly from the first edges and parallel to the base. The solder portions are each adapted to be soldered to one of the solder pads of the circuit board. The clamping portions extend obliquely toward each other from the two second edges of the base and are adapted to clamp a conductor of the wire inserted through the insertion hole and the through hole.

16 Claims, 4 Drawing Sheets

(56) References Cited

U.S. PATENT DOCUMENTS

| | | | | |
|---|---|---|---|---|
| 3,609,640 A * | 9/1971 | Longenecker | H01R 13/428 | 439/345 |
| 3,621,444 A * | 11/1971 | Stein | H05K 7/1038 | 439/109 |
| 3,654,583 A * | 4/1972 | Mancini | H05K 3/3447 | 439/82 |
| 3,778,755 A * | 12/1973 | Marks | H01R 12/58 | 439/853 |
| 3,805,116 A * | 4/1974 | Nehmann | G09B 23/185 | 361/809 |
| 3,824,557 A * | 7/1974 | Mallon | H01R 12/58 | 439/857 |
| 3,850,500 A * | 11/1974 | Cobaugh | H01R 13/113 | 439/858 |
| 3,915,544 A * | 10/1975 | Yurtin | H05K 3/326 | 439/786 |
| 3,950,065 A * | 4/1976 | Renn | H01R 4/2462 | 439/398 |
| 3,963,302 A * | 6/1976 | Gourley | H01R 13/114 | 439/867 |
| 3,992,076 A * | 11/1976 | Gluntz | H01R 12/718 | 439/853 |
| 4,076,369 A * | 2/1978 | Ostapovitch | H01R 13/114 | 439/852 |
| 4,152,042 A * | 5/1979 | Ostapovitch | H01R 13/114 | 439/852 |
| 4,232,931 A * | 11/1980 | Takeuchi | H01R 13/111 | 439/857 |
| 4,299,436 A * | 11/1981 | Ackerman | H01R 12/55 | 439/853 |
| 4,472,017 A * | 9/1984 | Sian | H01R 13/113 | 439/747 |
| 4,585,295 A * | 4/1986 | Ackerman | H01R 12/58 | 439/857 |
| 4,640,561 A * | 2/1987 | George | H01R 12/592 | 439/77 |
| 4,657,336 A * | 4/1987 | Johnson | H01R 12/58 | 439/82 |
| 4,708,416 A * | 11/1987 | Awano | H01R 13/11 | 439/851 |
| 4,784,622 A * | 11/1988 | Senor | H01R 12/58 | 439/853 |
| 4,813,881 A * | 3/1989 | Kirby | H01R 13/111 | 439/381 |
| 4,934,967 A * | 6/1990 | Marks | H01R 13/111 | 439/751 |
| 4,952,178 A * | 8/1990 | Beer | H01R 13/114 | 439/842 |
| 4,968,271 A * | 11/1990 | Buscella | H01R 13/11 | 439/850 |
| 5,064,379 A * | 11/1991 | Ryll | H01R 12/58 | 439/81 |
| 5,131,853 A * | 7/1992 | Meyer | H01R 4/028 | 439/82 |
| 5,169,322 A * | 12/1992 | Frantz | H01R 12/716 | 439/378 |
| 5,263,883 A * | 11/1993 | Kirayoglu | H01R 43/16 | 439/856 |
| 5,352,125 A * | 10/1994 | Banakis | H01R 4/028 | 439/78 |
| 5,494,456 A * | 2/1996 | Kozel | H01R 4/4827 | 439/439 |
| 5,615,944 A * | 4/1997 | Siegfried | H01R 33/02 | 313/318.02 |
| 5,788,539 A * | 8/1998 | Fedder | H01R 4/2429 | 439/682 |
| 5,975,963 A * | 11/1999 | Higuchi | H01R 4/028 | 439/851 |
| 6,000,974 A * | 12/1999 | Hotea | H01R 13/35 | 439/850 |
| 6,012,944 A * | 1/2000 | Hatakeyama | H01R 12/515 | 439/441 |
| 6,039,597 A * | 3/2000 | Getselis | F21S 8/00 | 439/439 |
| 6,051,781 A * | 4/2000 | Bianca | H05K 9/0016 | 174/250 |
| 6,080,008 A * | 6/2000 | Frantz | H01R 4/4881 | 439/441 |
| 6,089,880 A * | 7/2000 | Miyagawa | H01R 13/11 | 439/741 |
| 6,128,181 A * | 10/2000 | Higami | H01R 4/4818 | 174/252 |
| 6,193,567 B1 * | 2/2001 | Hsieh | H01R 43/16 | 439/84 |
| 6,210,240 B1 * | 4/2001 | Comerci | H01R 12/7088 | 439/853 |
| 6,264,498 B1 * | 7/2001 | Froberg | A61N 1/3752 | 439/441 |
| 6,319,076 B1 * | 11/2001 | Gollhofer | H01R 13/111 | 439/862 |
| 6,394,858 B1 * | 5/2002 | Geltsch | H01R 13/187 | 439/852 |
| 6,442,036 B2 * | 8/2002 | Komatsu | H01R 12/58 | 174/138 G |
| 6,511,336 B1 * | 1/2003 | Turek | H01R 13/113 | 439/246 |
| 6,561,828 B2 * | 5/2003 | Henrici | H01R 33/0827 | 439/239 |
| 6,570,306 B2 * | 5/2003 | Henrici | H01R 4/4818 | 313/318.01 |
| 6,814,598 B2 * | 11/2004 | Hoffmann | H01R 13/113 | 439/249 |
| 6,827,613 B2 * | 12/2004 | Ferderer | H01R 4/4818 | 439/439 |
| 6,991,498 B2 * | 1/2006 | Wertz | H01R 13/115 | 439/830 |
| 7,175,469 B1 * | 2/2007 | Daily | H01R 4/4818 | 439/441 |
| 7,357,651 B2 * | 4/2008 | Minoura | H01R 13/111 | 439/82 |
| 7,503,814 B1 * | 3/2009 | Lin | H01R 13/11 | 439/857 |
| 7,530,837 B2 * | 5/2009 | Nieleck | H02S 40/34 | 439/441 |
| 7,556,509 B1 * | 7/2009 | Oh | H01R 13/112 | 439/76.2 |
| 7,581,965 B1 * | 9/2009 | Upasani | H05K 3/32 | 439/82 |
| 7,654,874 B2 * | 2/2010 | Ader | H01H 85/203 | 439/853 |
| 7,704,103 B1 * | 4/2010 | Rhein | H01R 13/113 | 439/752.5 |
| 7,771,243 B2 * | 8/2010 | Peterson | H01R 13/113 | 439/857 |
| 7,988,506 B2 * | 8/2011 | Peterson | H01R 13/113 | 439/857 |
| 7,997,915 B2 * | 8/2011 | Pueschner | H01R 4/4818 | 439/268 |
| 8,113,859 B2 * | 2/2012 | Kim | H01R 33/02 | 439/239 |
| 8,328,586 B2 * | 12/2012 | Bies | H01R 4/4845 | 439/725 |
| RE44,490 E * | 9/2013 | Kirstein | H01R 4/4818 | 439/439 |
| 8,591,271 B2 * | 11/2013 | Bies | B60N 2/36 | 439/852 |
| 9,768,527 B2 * | 9/2017 | Bishop | H01R 12/515 | |
| 10,116,067 B2 * | 10/2018 | Bishop | H01R 12/718 | |
| 2005/0054244 A1 * | 3/2005 | Werner | H01R 13/112 | 439/682 |
| 2006/0286839 A1 * | 12/2006 | Bethurum | H01R 4/4818 | 439/188 |
| 2010/0173540 A1 * | 7/2010 | Lee | F21V 19/0085 | 439/861 |
| 2012/0083141 A1 * | 4/2012 | Molnar | H01R 12/7094 | 439/82 |

(56) References Cited

U.S. PATENT DOCUMENTS

2013/0210247 A1\* 8/2013 Wang ..................... H01R 12/57
439/83

\* cited by examiner

CONDUCTIVE TERMINAL AND CONNECTOR ASSEMBLY

CROSS-REFERENCE TO RELATED APPLICATION

This application claims the benefit of the filing date under 35 U.S.C. § 119(a)-(d) of Chinese Patent Application No. 201820113480.6, filed on Jan. 23, 2018.

FIELD OF THE INVENTION

The present invention relates to a conductive terminal and, more particularly, to a conductive terminal adapted to electrically connect a wire to a circuit board.

BACKGROUND

A wire is generally electrically connected to a circuit board by an electrical connector. When electrically connected to the circuit board, a conductive terminal of the electrical connector is generally fixed in an insulating housing in advance and then electrically connected to and fixed to the circuit board. Such a connector, however, is costly and the insulating housing occupies a large space on the circuit board.

In order to overcome these deficiencies, conductive terminals are provided that electrically connect the wire to the circuit board without a housing covering the conductive terminal. Such conductive terminals only allow the wire to be inserted from a single direction; demand is ever-increasing to insert the wire into the conductive terminal from a plurality of different direction. In addition, the conductive terminal without the housing has low locating and holding abilities for the wire and the wire is easily disconnected from the terminal. Furthermore, due to the structure and material of the conductive terminal, the wire may be displaced easily when inserted into the conductive terminal.

SUMMARY

A conductive terminal is adapted to electrically connect a wire to a circuit board. The circuit board has a through hole and solder pads on a surface of the circuit board. The conductive terminal comprises a base, a pair of mounting portions, and a pair of clamping portions. The base has a pair of opposing first edges, a pair of opposing second edges, and an insertion hole aligned with the through hole of the circuit board. The mounting portions include a pair of solder portions extending outwardly from the first edges and parallel to the base. The solder portions are each adapted to be soldered to one of the solder pads of the circuit board. The clamping portions extend obliquely toward each other from the two second edges of the base and are adapted to clamp a conductor of the wire inserted through the insertion hole and the through hole.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
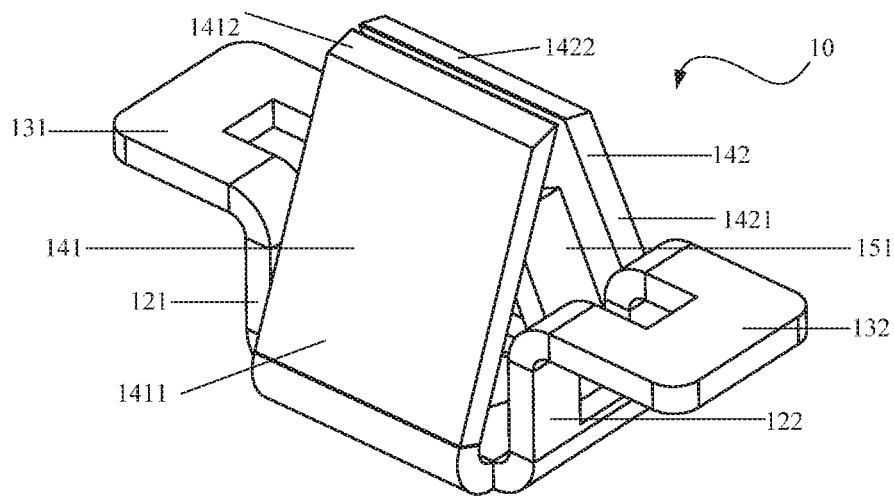
FIG. 1 is a top perspective view of a conductive terminal according to an embodiment.

The technical solution of the present disclosure will be described hereinafter in further detail with reference to the following embodiments, taken in conjunction with the accompanying drawings. In the specification, the same or similar reference numerals indicate the same or similar parts. The description of the embodiments of the present disclosure hereinafter with reference to the accompanying drawings is intended to explain the general inventive concept of the present disclosure, and should not be constructed as a limitation to the present disclosure.

In addition, in the following detailed description, for the sake of explanation, numerous specific details are set forth in order to provide a thorough understanding of the disclosed embodiments. It will be apparent, however, one or more embodiments may also be practiced without these specific details. In other instances, well-known structures and devices are illustrated schematically in order to simplify the drawing.

Figure 2:
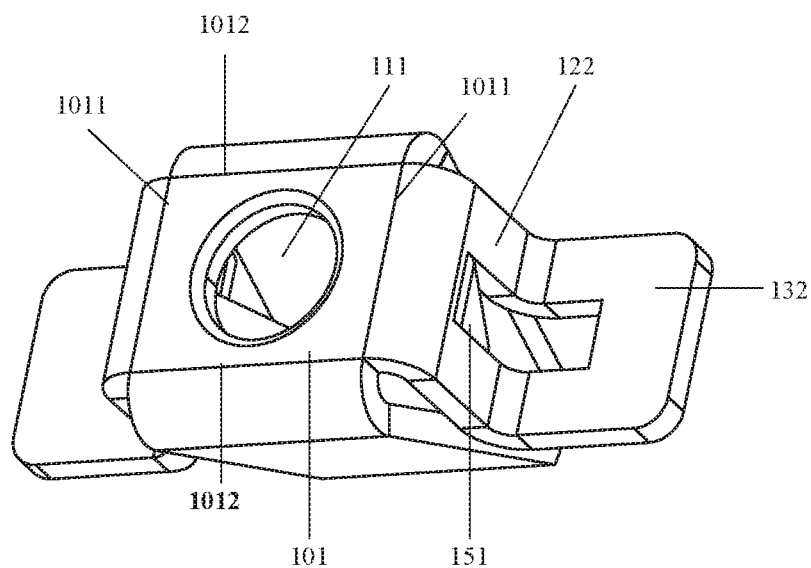
FIG. 2 is a bottom perspective view of the conductive terminal of FIG. 1.

A conductive terminal 10 according to an embodiment is shown in FIGS. 1 and 2. The conductive terminal 10 is adapted to electrically connect a wire 30 to a circuit board 20, shown in FIGS. 3-8. The conductive terminal 10 includes a base 101, a pair of mounting portions, and a pair of clamping portions 141, 142. In an embodiment, the conductive terminal 10 is formed only of a single conductive sheet, for example, a copper sheet. That is, when the conductive terminal 10 is unfolded, it is a single piece of a conductive sheet.

Figure 3:
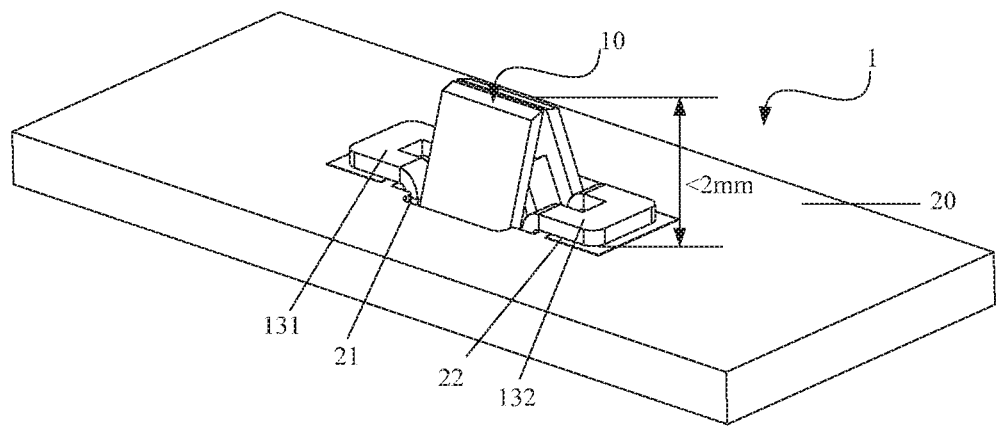
FIG. 3 is a top perspective view of the conductive terminal of FIG. 1 mounted in a first orientation on a circuit board.

The circuit board 20, as shown in FIG. 3, has a through hole 21 adapted to accommodate a portion of the conductive terminal 10 therethrough, and a pair of solder pads 22 on a surface thereof for soldering the conductive terminal 10 to the circuit board 20.

The base 101, shown in FIGS. 1 and 2, is in the form of a flat plate and includes two opposing first edges 1011 and two opposing second edges 1012. The first edges 1011 are perpendicular to the second edges 1012. The base 101 is formed with an insertion hole 111 extending in a vertical direction. The insertion hole 111 is aligned with the through hole 21 of the circuit board 20 when the conductive terminal 10 is mounted on the circuit board 20, and a conductor 301 of the wire 30 is inserted into the insertion hole 111 and the through hole 21.

The pair of mounting portions, as shown in FIGS. 1 and 2, include two solder portions 131, 132 that extend outwardly from the two first edges 1011 parallel to the base 101. The two solder portions 131, 132 are adapted to be soldered to the solder pads 22 of the circuit board 20. The solder portions 131, 132 are respectively located between the base 101 and an end of the clamping portions 141, 142 in the vertical direction. As shown in FIGS. 1 and 2, the solder portions 131 and 132 have flat surfaces such that the two solder portions 131 and 132 may be soldered to the circuit board 20 by a surface mount technology (SMT). The mounting portions further include two transition portions 121, 122 respectively connected between the first edges 1011 and the solder portions 131, 132. The transition portions 121, 122 are substantially perpendicular to the base 101 and the solder portions 131, 132.

The pair of clamping portions 141, 142, as shown in FIGS. 1 and 2, extend upward obliquely toward each other respectively from the two second edges 1012 of the base 101. The pair of clamping portions 141, 142 are adapted to clamp the conductor 301 inserted through the insertion hole 111 and the through hole 21. The clamping portions 141 and 142 include elastic cantilevers 1411 and 1421. After the conductor 301 of the wire 30 is inserted into the insertion hole 111 of the base 101, the elastic cantilevers 1411, 1421 are elastically deformed under a pressing force of the conductor 31 and are brought into electrical contact with the conductor 301, thereby achieving reliable electrical contact between the conductive terminal 10 and the wire 30. The clamping portions 141 and 142 have sharp end portions 1412 and 1422, and when the conductor 301 inserted into the insertion hole 111 is pulled outward in a direction opposite to an insertion direction of the wire, the sharp end portions 1412 and 1422 of the clamping portions 141 and 142 penetrate a sheath 302 of the wire 30, preventing the conductor 301 from being pulled out from the insertion hole 111. The conductor 301 of the wire 30 is thus reliably held in the insertion hole 111 of the base 101. In an alternative embodiment, the conductor 301 of the wire 30 is inserted between the clamping portions 141, 142 after peeling off the sheath 302.

The conductive terminal 10, as shown in FIGS. 1 and 2, further includes two guiding portions 151 that extend obliquely toward each other from the two first edges 1011 of the base 101. During insertion of the conductor 301 of the wire 30, the clamping portions 141 and 142 hold the conductor 301 on opposite sides of the conductor 301, and the two guiding portions 151 are arranged on another two opposite sides of the conductor 301, for example, in a perpendicular direction to the clamping portions 141 and 142, so that displacement of the wire 30 is prevented during the insertion.

A connector assembly 1 adapted to electrically connect the wire 30 to the circuit board 20 is shown in FIG. 3. The connector assembly 1 includes the conductive terminal 10 and the circuit board 20.

As shown in FIG. 3, the through hole 21 has a size slightly larger than that of the base 101 of the conductive terminal 10 to allow the base 101 of the conductive terminal 10 to pass through the through hole 21. In an exemplary embodiment, when the conductor 301 of the wire 30 is inserted into the insertion hole 111, the clamping portions 141, 142 are pushed by the conductor 301 and then separated from each other, and the separated clamping portions 141, 142 abut against a peripheral wall of the through hole 21. The through hole 21 may thereby enhance the clamping action of the clamping portions 141, 142 on the conductor 301.

In an exemplary embodiment, with suction nozzles of a vacuum adsorption apparatus sucking the solder portions 131, 132 of the conductive terminal 10, and with the base 101 being located on the side of the circuit board 20 opposite to the solder pads 22, as in FIG. 3, the base 101 passes through the through hole 21 until the two solder portions 131, 132 are placed on the solder pads 22 on the surface of the circuit board 20. The conductive terminal 10 is then soldered to the solder pads 22 of the circuit board 20 by the surface mount technology. A reliable electrical connection between the conductive terminal 10 and the circuit board 20 is achieved.

Figure 4:
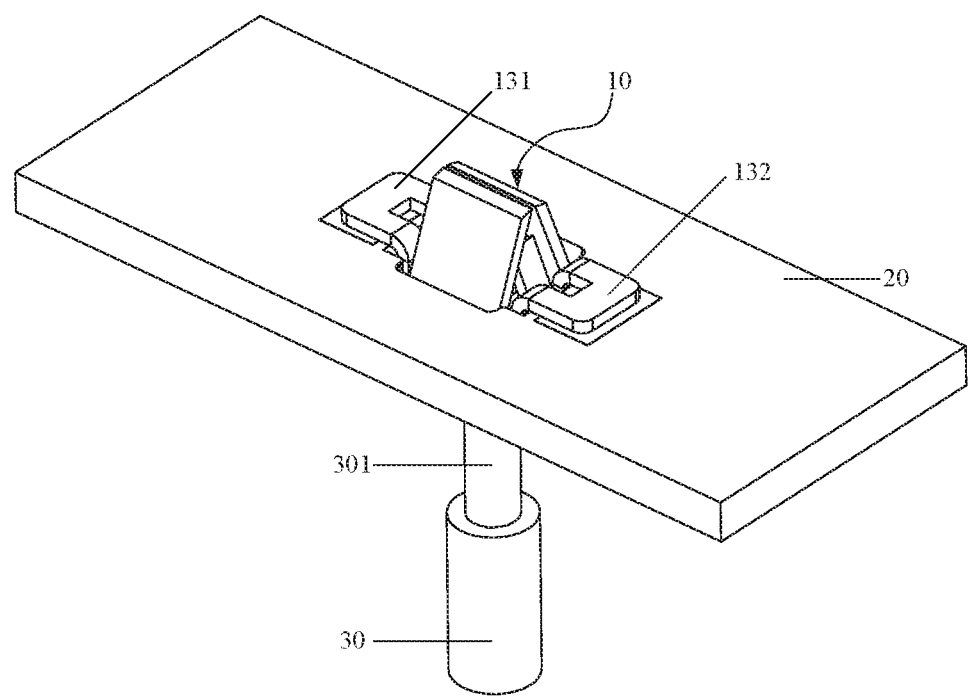
FIG. 4 is a top perspective view of the conductive terminal mounted in the first orientation on the circuit board with a wire prior to insertion of the wire.
Figure 5:
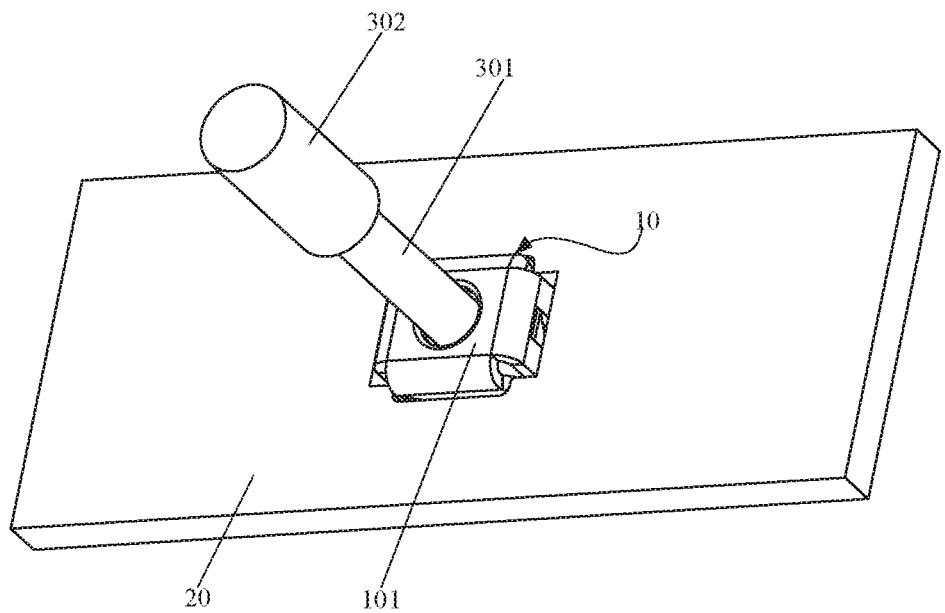
FIG. 5 is a bottom perspective view of the conductive terminal mounted in the first orientation on the circuit board with the wire inserted into the conductive terminal.
Figure 6:
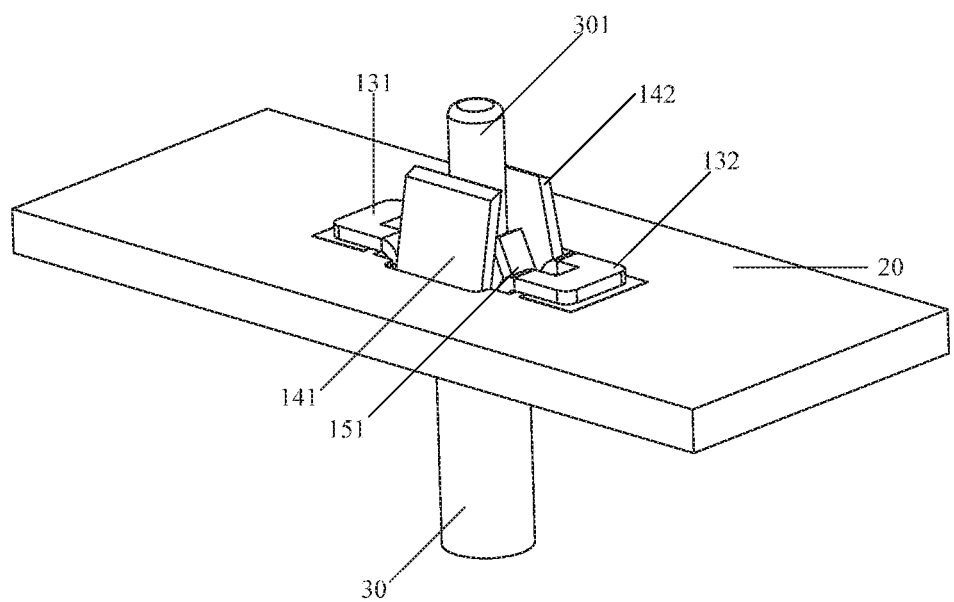
FIG. 6 is a top perspective view of the conductive terminal mounted in the first orientation on the circuit board with the wire inserted.

As shown in FIGS. 4-6, the conductor 301 at one end of the wire 30 is inserted from below the circuit board 20 into the insertion hole 111 of the conductive terminal 10, which is soldered to the circuit board 20 as shown in FIG. 3, until the conductor 301 comes into contact with the two guiding portions 151. The guiding portions 151 restrict the displacement of the conductor 301 during insertion. The elastic cantilevers 1411, 1421 of the clamping portions 141, 142 are brought into elastic and electrical contact with the inserted conductor 301, forming a reliable electrical connection between the wire 30 and the conductive terminal 10.

Figure 7:
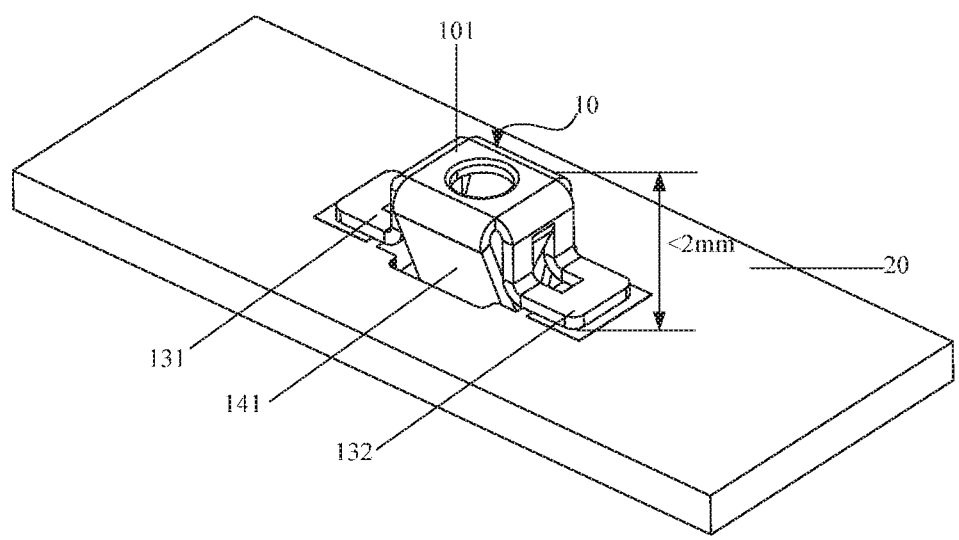
FIG. 7 is a top perspective view of the conductive terminal of FIG. 1 mounted in a second orientation on the circuit board.

In an embodiment shown in FIG. 7, with the suction nozzles of the vacuum adsorption apparatus sucking the solder portions 131, 132 of the conductive terminal 10, and with the base 101 located on the same side of the circuit board 20 as the solder pads 22, the clamping portions 141, 142 partly pass through the through hole 21 of the circuit board 20 downward until the two solder portions 131, 132 are placed on the solder pads 22 on the surface of the circuit board 20. The conductive terminal 10 is then soldered to the solder pads 21 of the circuit board 20 by the surface mount technology and a reliable electrical connection between the conductive terminal 10 and the circuit board 20 is achieved.

Figure 8:
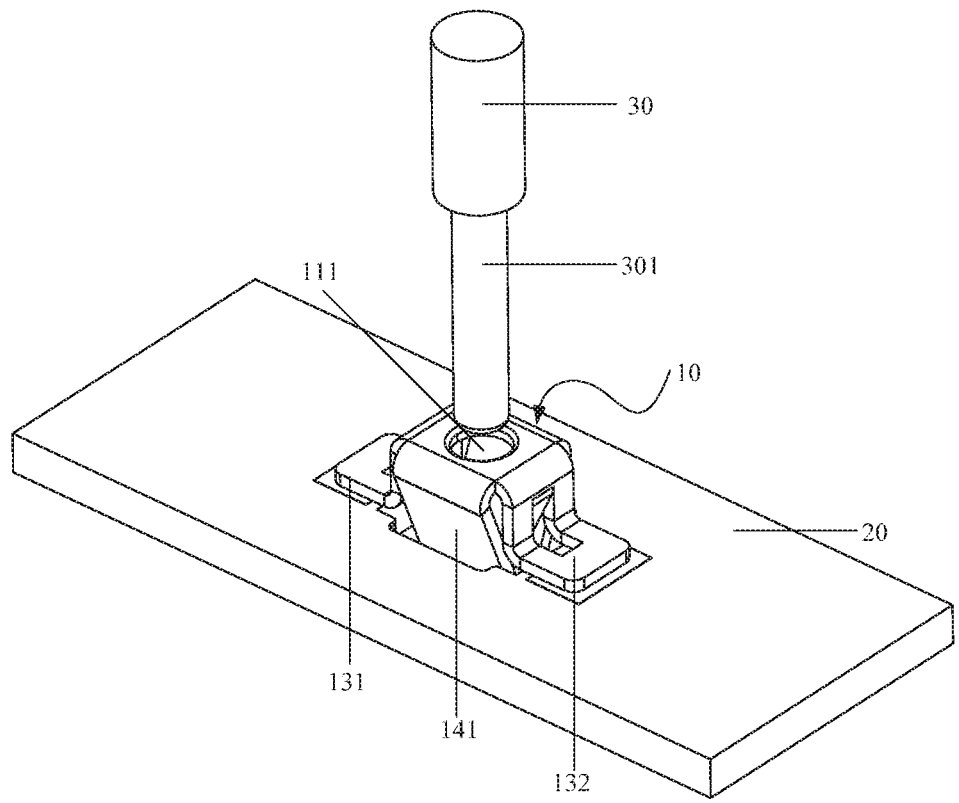
FIG. 8 is a top perspective view of the conductive terminal mounted in the second orientation on the circuit board prior to insertion of the wire.

As shown in FIGS. 7 and 8, the conductor 301 is inserted from above the circuit board 20 into the insertion hole 111 of the conductive terminal 10, which is soldered to the circuit board 20, until the conductor 301 comes into contact with the two guiding portions 151. The guiding portions 151 restrict the displacement of the conductor 301 during insertion. The elastic cantilevers 1411, 1421 of the clamping portions 141, 142 are brought into elastic and electrical contact with the inserted conductor 301, forming a reliable electrical connection between the wire 30 and the conductive terminal 10.

As shown in FIGS. 3 and 7, after the conductive terminal 10 is soldered to the circuit board 20, a height of the conductive terminal 10 projecting beyond the surface of the circuit board 20 where the solder pad 22 is provided is less than 2 mm, so that the conductive terminal 10 occupies little space.

The conductive terminal 10 disclosed herein permits the insertion of the wire 30 into the conductive terminal 10 from both above and below the circuit board 20, forming a reliable electrical connection between the wire 30 and the circuit board 20 in either direction. Further, no displacement occurs during the insertion of the wire 30 and the wire 30 is not easily released from the insertion hole 111 after being inserted and clamped.

What is claimed is:

1. A conductive terminal adapted to electrically connect a wire to a circuit board, the circuit board having a through hole and a plurality of solder pads on a surface of the circuit board, comprising:
   a base having a pair of opposing first edges, a pair of opposing second edges, and an insertion hole aligned with the through hole of the circuit board;

a pair of mounting portions including a pair of solder portions extending outwardly from the first edges and parallel to the base, the solder portions each adapted to be soldered to one of the solder pads of the circuit board;

a pair of clamping portions extending obliquely toward each other from the two second edges of the base, the clamping portions adapted to clamp a conductor of the wire inserted through the insertion hole and the through hole; and a pair of guiding portions extending upwardly obliquely toward each other from the first edges of the base.

2. The conductive terminal of claim 1, wherein each of the mounting portions includes a transition portion connected between one of the first edges and one of the solder portions.

3. The conductive terminal of claim 2, wherein each of the transition portions is substantially perpendicular to the base and the solder portions.

4. The conductive terminal of claim 1, wherein the solder portions are disposed between the base and an end of the clamping portions.

5. The conductive terminal of claim 4, wherein the base is capable of being disposed on a same side of the circuit board as the solder pads or on a side of the circuit board opposite the solder pads.

6. The conductive terminal of claim 1, wherein the conductive terminal is formed from a single conductive sheet.

7. The conductive terminal of claim 1, wherein the guiding portions prevent displacement of the wire during insertion of the wire.

8. The conductive terminal of claim 1, wherein each clamping portion has a sharp end portion penetrating the conductor when the conductor is pulled outward and preventing the conductor from being pulled out of the insertion hole.

9. The conductive terminal of claim 1, wherein each solder portion has a flat surface soldered to the one of the solder pads by a surface mount technology.

10. The conductive terminal of claim 1, wherein, with the conductive terminal fully inserted into the through hole of the circuit board, a height of the conductive terminal above the surface of the circuit board is less than 2 mm.

11. The conductive terminal of claim 1, wherein each of the first edges is perpendicular to each of the second edges.

12. A connector assembly, comprising:

a circuit board having a through hole and a plurality of solder pads on a surface of the circuit board; and a conductive terminal adapted to electrically connect a wire to the circuit board, the conductive terminal including:

a base having a pair of opposing first edges, a pair of opposing second edges, and an insertion hole aligned with the through hole of the circuit board;

a pair of mounting portions including a pair of solder portions extending outwardly from the first edges and parallel to the base, the solder portions each adapted to be soldered to one of the solder pads of the circuit board;

a pair of clamping portions extending obliquely toward each other from the two second edges of the base, the clamping portions adapted to clamp a conductor of the wire inserted through the insertion hole and the through hole; and a pair of guiding portions extending upwardly obliquely toward each other from the first edges of the base.

13. A connector assembly, comprising:

a circuit board comprising a first side and a second side opposite the first side, the circuit board having a through hole extending between the first side and the second side, and a plurality of solder pads on the first side of the circuit board; and a conductive terminal adapted to electrically connect a wire to the circuit board, the conductive terminal including:

a base having a pair of opposing first edges, a pair of opposing second edges, and an insertion hole aligned with the through hole of the circuit board;

a pair of mounting portions including a pair of solder portions extending outwardly from the first edges and parallel to the base, the solder portions each adapted to be soldered to one of the solder pads of the circuit board;

a pair of guiding portions extending upwardly obliquely toward each other from the first edges of the base; and a pair of clamping portions extending obliquely toward each other from the two second edges of the base, the clamping portions adapted to clamp a conductor of the wire inserted through the insertion hole and the through hole, wherein the conductive terminal is arranged on the circuit board such that the pair of solder portions are positioned on the first side of the circuit board, and the base is positioned proximate the second side of the circuit board opposite the first side.

14. The connector assembly of claim 13, wherein each of the mounting portions includes a transition portion connected between one of the first edges and one of the solder portions.

15. The connector assembly of claim 14, wherein each of the transition portions extends through the through hole of the circuit board.

16. The connector assembly of claim 15, wherein each of the transition portions is substantially perpendicular to the base and the solder portions.

* * * * *